United States Patent
Yamada

(10) Patent No.: US 6,374,391 B1
(45) Date of Patent: Apr. 16, 2002

(54) METHOD FOR ESTIMATING PARASITIC CAPACITANCE COUPLED TO SIGNAL LINE LONGER THAN CRITICAL LENGTH AT HIGH-SPEED

(75) Inventor: Kenta Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/372,964

(22) Filed: Aug. 12, 1999

(30) Foreign Application Priority Data

Aug. 17, 1998 (JP) .......................................... 10-230967

(51) Int. Cl.[7] .............................................. G06F 17/50
(52) U.S. Cl. .......................................................... 716/5
(58) Field of Search ........................................ 716/1–21

(56) References Cited

U.S. PATENT DOCUMENTS

| | | | | |
|---|---|---|---|---|
| 5,568,395 A | * | 10/1996 | Huang ............................. | 716/4 |
| 5,761,080 A | * | 6/1998 | DeCamp et al. ................ | 716/8 |
| 5,889,677 A | * | 3/1999 | Yasuda et al. .................. | 716/6 |
| 5,926,397 A | * | 7/1999 | Yamanouchi ................ | 716/14 |
| 6,118,937 A | * | 9/2000 | Iwasaki ......................... | 716/10 |
| 6,185,722 B1 | * | 2/2001 | Darden et al. .................. | 716/5 |
| 6,240,542 B1 | * | 5/2001 | Kapur .......................... | 716/12 |

FOREIGN PATENT DOCUMENTS

| | | | | |
|---|---|---|---|---|
| JP | 62-84545 | 4/1987 | ........... | H01L/27/04 |
| JP | 2-162759 | 6/1990 | ........... | H01L/27/06 |
| JP | 5-151716 | 6/1993 | ........... | G11B/20/12 |
| JP | 6-120343 | 4/1994 | ........... | H01L/21/82 |
| JP | 7-202126 | 8/1995 | ........... | H01L/27/04 |
| JP | 8-77243 | 3/1996 | ........... | G06F/17/50 |
| JP | 08-123848 A | * 5/1996 | ........... | G06F/17/50 |
| JP | 11-340333 | 12/1999 | ........... | H01L/21/82 |

OTHER PUBLICATIONS

Senthinathan et al., "Modeling and Simulation of Coupled Transmission Line Interconnects Over a Noisy Reference Plane", IEEE Transactions on Components, Hybrids, and Manufacturing Technology, vol. 16, No. 7, Nov. 1993, pp. 705–713.*

* cited by examiner

*Primary Examiner*—Matthew Smith
*Assistant Examiner*—Phallaka Kik
(74) *Attorney, Agent, or Firm*—Scully, Scott, Murphy & Presser

(57) ABSTRACT

The parasitic capacitance coupled to a signal line is simply proportional to the length of the signal line when the signal line is longer than a critical length, and an estimation of the parasitic capacitance is branched into two courses, i.e., a multiplication of a unit capacitance by the length of a signal line and an accumulation of parasitic capacitances coupled to parts of the signal line depending upon the length so that the estimation is completed within a short time.

11 Claims, 8 Drawing Sheets

METHOD FOR ESTIMATING PARASITIC CAPACITANCE COUPLED TO SIGNAL LINE LONGER THAN CRITICAL LENGTH AT HIGH-SPEED

FIELD OF THE INVENTION

This invention relates to a design technology for an integrated circuit and, more particularly, to a method for estimating parasitic capacitance coupled to a conductive pattern forming a part of an integrated circuit.

DESCRIPTION OF THE RELATED ART

Various circuit components are fabricated on a semiconductor substrate, and conductive strips are selectively connected to the circuit components for forming an integrated circuit on the semiconductor substrate. The conductive strips are multi-layered, and inter-level insulating layers are inserted between the conductive strips on different levels.

The conductive strips and the gap therebetween have been getting narrower and narrower, and the inter-level insulating layers have become thinner. For this reason, it is necessary for the designer to exactly evaluate the parasitic capacitance between the conductive strips on an inter-level insulating layer and the parasitic capacitance between the conductive strip on the inter-level insulating layer and the conductive strip over or under the inter-level insulating layer. The parasitic capacitance retards the signal propagation on the conductive strip. The manufacturer calculates the parasitic capacitance coupled to each of the conductive strips, and simulates the circuit behavior of the integrated circuit.

A typical example of the estimation starts with dividing a signal line into parts, and each of the parts is compared with samples in a database. The parasitic capacitance of each sample is known, and the parasitic capacitance of each part is determined by selecting one of the samples. Finally, the parasitic capacitances of the parts are added together, and the parasitic capacitance of the single line is finally determined.

FIG. 1 illustrates the prior art method for estimating the parasitic capacitances of interconnection. The layout of an integrated circuit is assumed to be designed. Circuit components and interconnections form the integrated circuit. Most of the interconnections serve as signal lines. Firstly, a signal line is extracted from the integrated circuit as by step S200. The signal line is divided into parts such as those on a grating as by step S201. All the parts have a unit length.

The prior art method proceeds to step S203, and one of the parts is extracted. The environment around the extracted part is analyzed as by step S204. In the analysis, it is considered what kind of circuit components is closed to the extracted part. The dimensions of an adjacent signal line, the distance therefrom and the material of the layers therearound are further considered. A capacity parameter table and a mathematical expression have been already prepared for calculating a capacitance as by step S205 and S206. When the environment is determined, capacity parameters approximated to the extracted part are selected from the capacity parameter table, and a parasitic capacitance is calculated by substituting the selected parameters into the mathematical expression. Then, a parasitic capacitance is determined as by step S207.

Then, the control checks the signal line to see whether or not the parasitic capacitances are calculated for all the parts as by step S208. If the answer at step S208 is given negative, the control returns to step S203, and reiterates the loop consisting of steps S203 to S208. When the capacitances are determined for all the parts, the answer at step S208 is given affirmative, and the control proceeds to step S209.

The control calculates the total of the capacitances at step S209, and checks the conductive pattern to see whether or not the parasitic capacitances are determined for all the signal lines as by step S210. When there is another part to be estimated, the answer at step S210 is given negative, and the control returns to step S200. While the answer at step S210 is given negative, the control repeats the loop consisting of steps S200 to S210. When the parasitic capacitance is calculated for all the signal lines, the answer at step S210 is given affirmative, and the control reaches "end". Japanese Patent Publication of Unexamined Application No. 6-120343 discloses a method like the prior art method described hereinbefore.

The prior art method takes the environment around each part of the signal line into account, and the analyst can accurately estimate the parasitic capacitance by using the prior art method. However, a problem is encountered in the prior art method in that the estimation consumes a long time. This is because of the fact that the control repeats the loop consisting of steps S203 to S208 for a signal line and the loop consisting of steps S200 to S210 for the integrated circuit.

SUMMARY OF THE INVENTION

It is therefore an important object of the present invention to provide a method for estimating parasitic capacitances of wiring within a short time.

The present inventor contemplated the problem inherent in the prior art method. The present inventor noticed that the parasitic capacitance was proportional to the length of the signal line in so far as the signal line exceeded a critical length. The present inventor concluded that signal lines longer than the critical length did not require the repetition of the calculation.

In accordance with one aspect of the present invention, there is provided a method for estimating a parasitic capacitance coupled to a signal line forming a part of an integrated circuit incorporated in a semiconductor device, and the method comprises the steps of a) preparing a first piece of data information indicative of a minimum length for calculating a parasitic capacitance as a function of the length of a signal line, a second piece of data information indicative of a capacitance considered to be coupled to a unit length of signal lines and third pieces of data information used for estimating the parasitic capacitance coupled to a signal line through a known method, b) determining the length of a given signal line, c) comparing the length of the given signal line with the minimum length so as to determine whether or not the function is available for determining the parasitic capacitance coupled to the given signal line, d) determining the parasitic capacitance coupled to the given signal line by using the function once when the given signal line is equal to or greater than the minimum length and e) determining the parasitic capacitance coupled to the given signal line by using the known method without execution of the step d) when the given signal line is less than the minimum length.

BRIEF DESCRIPTION OF THE DRAWINGS

The features and advantages of the method will be more clearly understood from the following description taken in conjunction with the accompanying drawings in which.

CRITICAL LENGTH FOR CALCULATION

Figure 1:
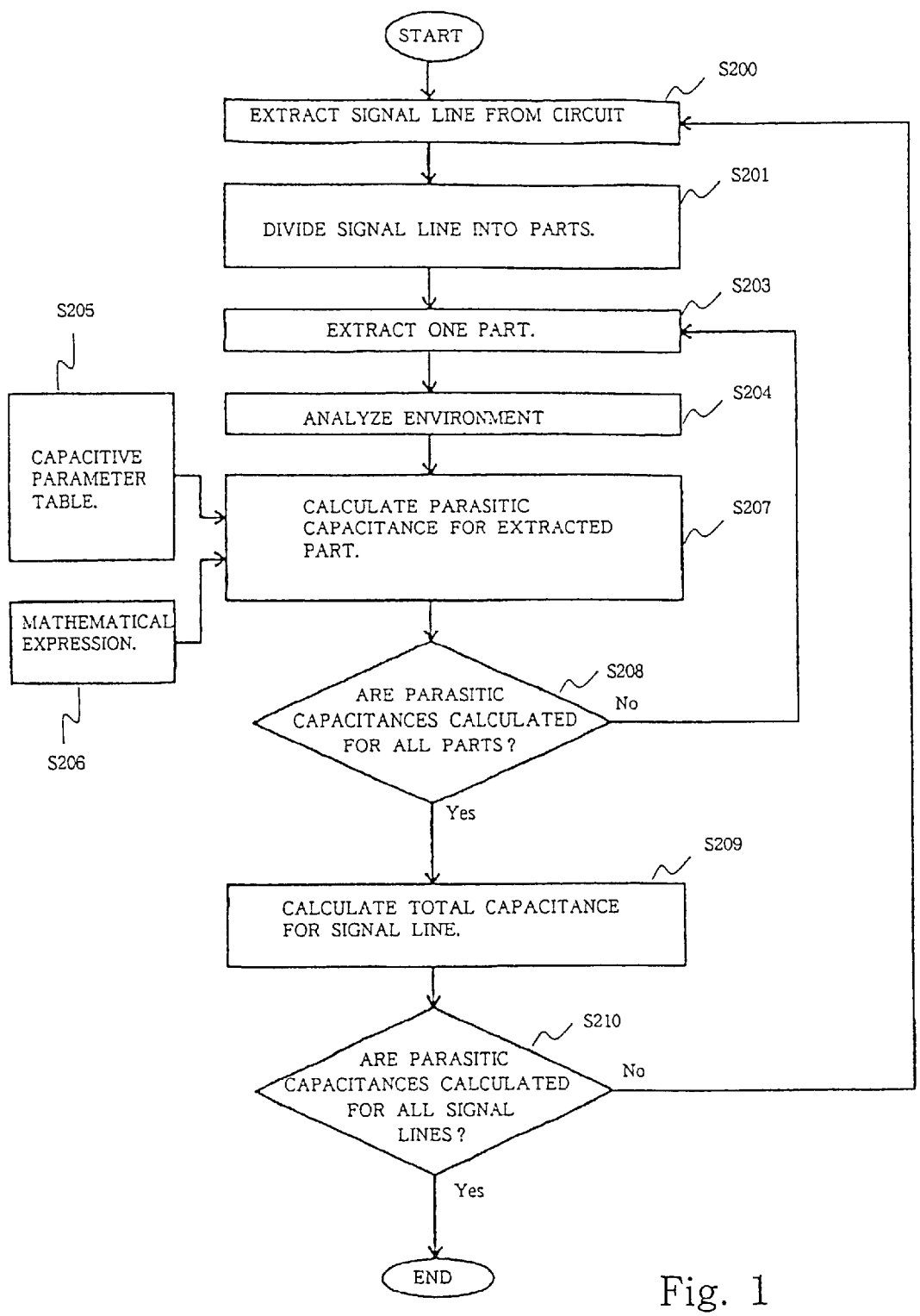
FIG. 1 is a flow chart showing the prior art method for estimating parasitic capacitances of the interconnections forming the part of the integrated circuit.
Figure 2:
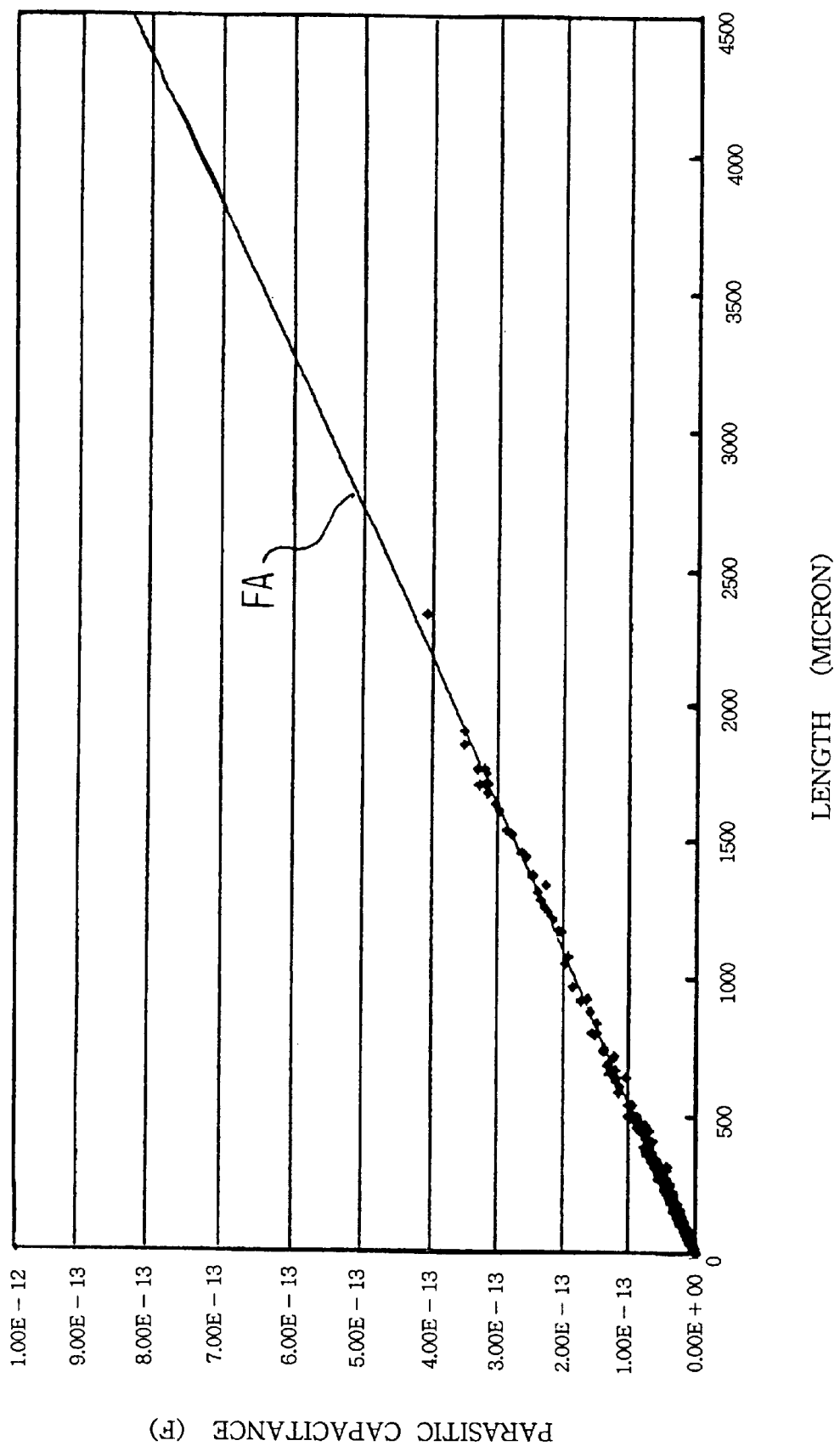
FIG. 2 is a graph showing relation between a parasitic capacitance and a length of signal lines.
Figure 3:
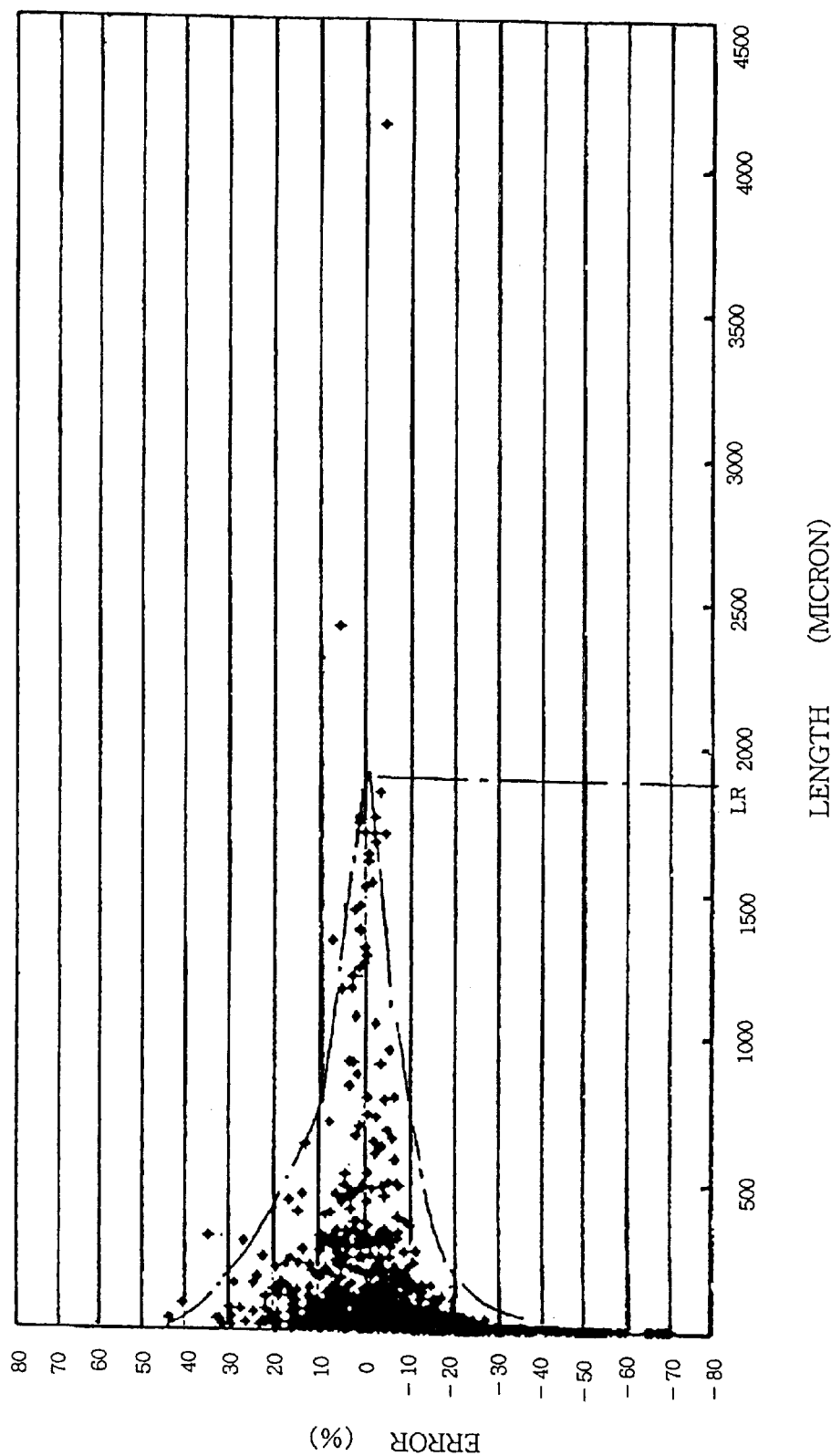
FIG. 3 is a graph showing a dispersion of errors in terms of the length of the signal lines.

The present inventor calculated the parasitic capacitance for signal lines through the prior art method shown in FIG. 1. The signal lines were incorporated in various kinds of integrated circuit, and were different in length. The present inventor plotted the parasitic capacitance in terms of the length as shown in FIG. 2. The abscissa was indicative of the length of the signal lines, and the axis of coordinates was indicative of the parasitic capacitance. The plots approximated to a linear line FA passing through the origin of coordinates. Subsequently, the present inventor calculated an error ER of estimation as follows.

$$ER=(CA\text{-}CC)\div CA\times 100$$

where CC was the capacitance estimated through the method shown in FIG. 1 and CA was the corresponding capacitance on the linear line FA. The error ER was plotted in terms of the length of the signal lines, and FIG. 3 illustrated the relation between the error and the length. When the length was short, the plots were widely dispersed. The plots gradually converged, and the error ER becomes approximately equal to zero after a critical length LR. This meant that the estimated capacitance was substantially on the linear line FA after the critical length LR. The reason for the wide dispersion in the short length was that peculiar environment around a part of the signal line strongly affected the estimated capacitance. However, the influence of the peculiar environment was reduced inversely to the length of the signal lines, and the plots got closer to the linear line FA. When the signal lines exceeded the critical length LR, the influence of the peculiar environment became ignoreable, and the error ER was approximately equal to zero. This meant that the plots were on the linear line FA. When integrated circuit devices were categorized in a certain device and the signal lines were designed under the same design rules and same materials, the linear line FA was available for the estimation regardless of the wiring pattern. The present inventor concluded that the parasitic capacitance was simply estimable on the basis of the length of the signal line after exceeding the critical length LR.

The critical length LR was determined as follows. An envelop curve was determined as indicated by dot-and-dash line (see FIG. 3). The envelope curve was close to the error ER of zero at a certain length. The present inventor determined the certain length to be the critical length LR. The critical length LR was shared between signal lines on different wiring pattern under the above-described conditions.

The present inventor determined the gradient of the linear line FA to be a capacitance CR coupled to unit length. The gradient was the ratio of the variation of the capacitance CA to the variation of the length of the signal line.

The present invention was made on the basis of the above-described discovery, and proposes to branch the estimating sequence into two courses depending upon the length of a signal line.

DESCRIPTION OF THE PREFERRED EMBODIMENT

Method for Estimating Parasitic Capacitance

Figure 4:
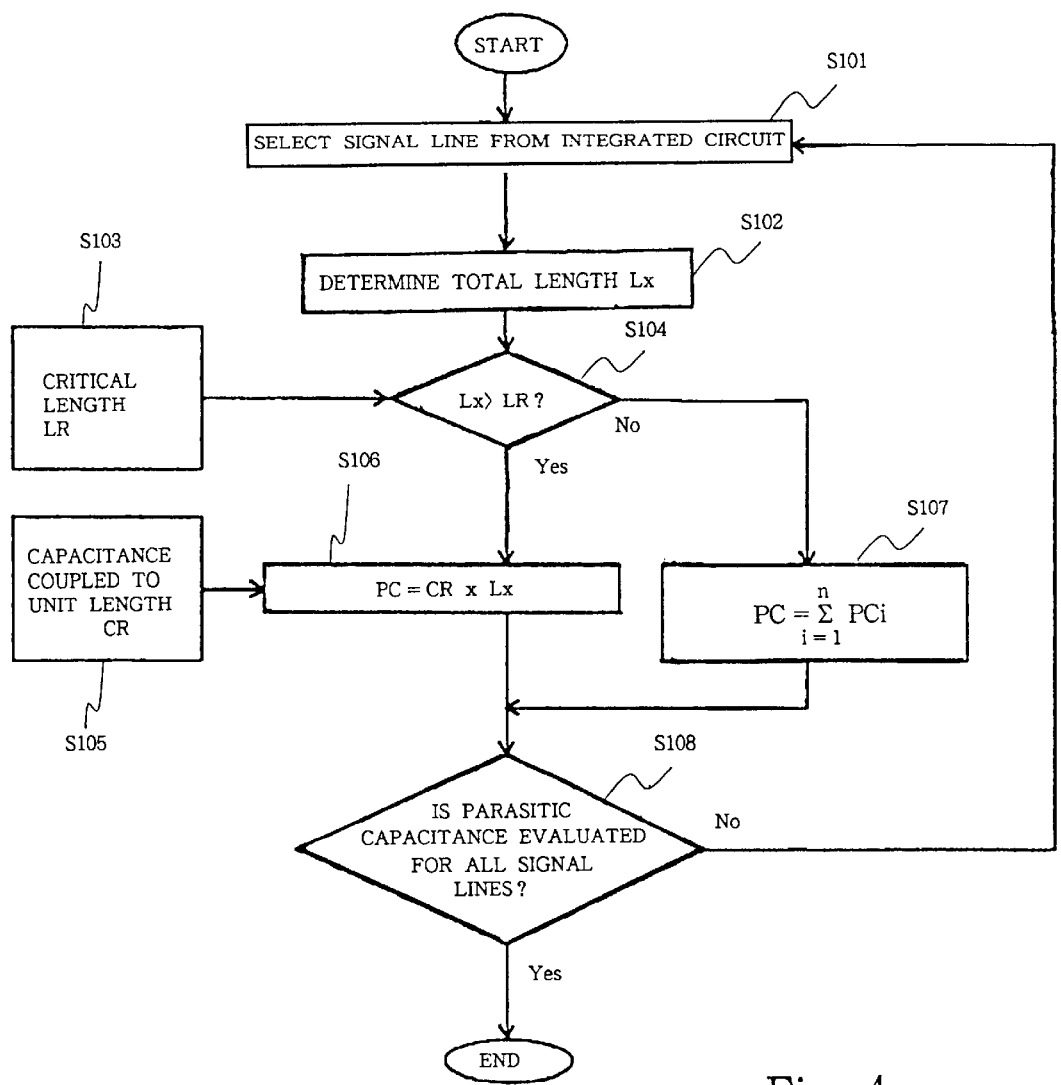
FIG. 4 is a flow chart showing a method for estimating parasitic capacitances of interconnections according to the present invention.

FIG. 4 illustrates an estimating sequence embodying the present invention. A computer system traces the estimating sequence. An integrated circuit has been laid out on a semiconductor chip, and an analyst is expected to simulate the circuit behavior of the integrated circuit. For this reason, the analyst needs to estimate the parasitic capacitance coupled to signal lines of the integrated circuit. Design data has been already loaded to the computer system. The design data contains pieces of data information representative of the dimensions of each signal line, pieces of data information representative of environment around each of the signal lines, pieces of data information representative of a grating used in a layout design work, pieces of data information representative of a capacity parameter table, pieces of data information representative of mathematical expression for calculating parasitic capacitance on the basis of the capacity parameters, a piece of data information indicative of the critical length LR and a piece of data information indicative of a value of parasitic capacitance CR coupled to unit length. The value of parasitic capacitance CR is available for a signal line longer than the critical length LR. A circuit component close to each signal line, other signal lines adjacent to the signal line, inter-level insulating layers under and over the signal line and insulating layers around the signal line form the environment, and the piece of data information is representative of the dimensions of each environmental component, material, i.e., the dielectric constant and so fourth to be required for calculating the parasitic capacitance coupled to the associated signal line. The environment is usually varied along the signal line, and the piece of data information is divided into sub-pieces of data information respectively representative of the environment around parts of the signal lines.

The analyst starts the estimation. The analyst firstly selects a signal line from the integrated circuit as by step S101. The selected signal line may have a corner and/or a branch. The computer system determines the total length Lx of the selected signal line as by step S102. The computer system fetches the piece of data information indicative of the critical length LR as by step S103, and compares the total length with the critical length LR to see whether or not the selected signal line is longer than the critical length LR as by step S104.

If the answer at step S104 is affirmative, the computer system fetches the piece of data information representative of the value of parasitic capacitance CR coupled to the unit length as by step S105, and multiplies the value of parasitic capacitance CR by the total length Lx as by step S106. The product is indicative of the value of parasitic capacitance PC coupled to the selected signal line. Thus, the computer system determines the parasitic capacitance PC coupled to the selected signal line longer than the critical length LR by using the multiplication without repetition.

On the other hand, when the answer at step S104 is negative, the computer system proceeds to step S107. The computer system divides the selected signal line into parts n, and repeatedly calculates the parasitic capacitance PCi coupled to each part by using the parameters and the mathematical expression. Finally, the computer system adds the values of parasitic capacitance PCi to one another, and determines the parasitic capacitance PC coupled to the selected signal line. Thus, the computer system determines the parasitic capacitance PC in the similar manner to the prior art method shown in FIG. 1.

Upon completion of the calculation at step S106 or S107, the computer system checks the integrated circuit to see whether or not the parasitic capacitance PC is evaluated for all the signal lines as by step S108. If the answer at step S108 is given negative, the computer system returns to step S101, and selects another signal line from the integrated circuit. Thus, the computer system reiterates the loop consisting of steps S101 to S108 for calculating the parasitic capacitance PC for all the signal lines. When the computer system determines the parasitic capacitance PC of the last signal line, the answer at step S108 is changed to affirmative, and the computer system reaches "end".

Figure 5:
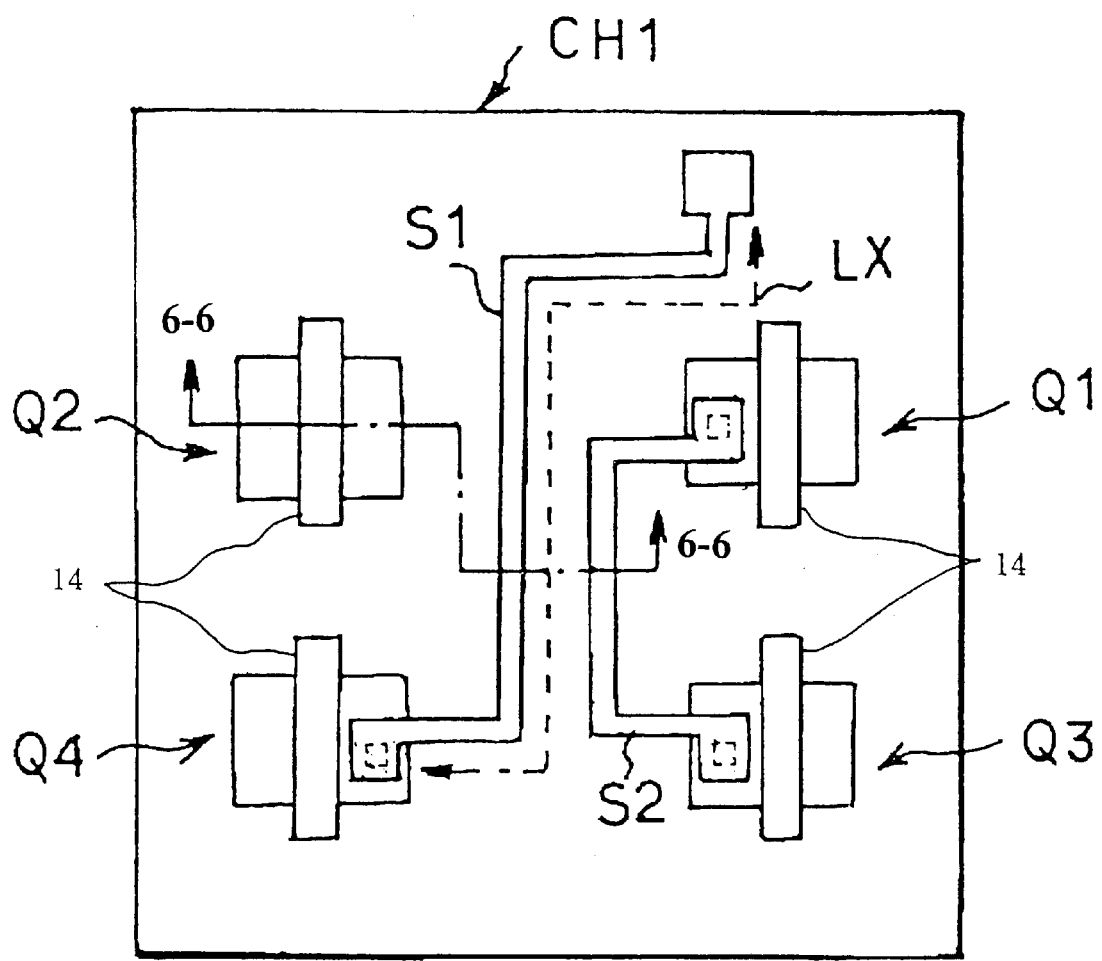
FIG. 5 is a plane view showing a layout of an integrated circuit to be investigated.
Figure 6:
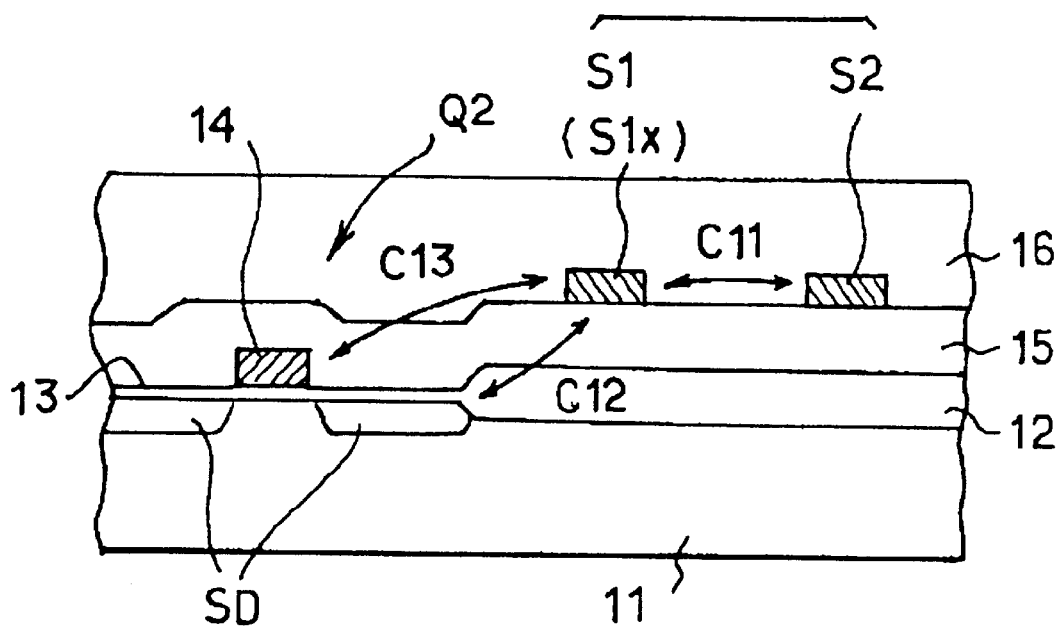
FIG. 6 is a cross sectional view taken along line 6—6 of FIG. 5 and showing the structure of the integrated circuit.

The method according to the present invention is detailed on the assumption that an integrated circuit shown in FIGS. 5 and 6 is to be investigated. The integrated circuit is firstly described. A semiconductor chip CH1 contains the integrated circuit, and field effect transistors Q1, Q2, Q3 and Q4 and signal lines S1 and S2 form in combination the integrated circuit together with other circuit components (not shown), other signal lines (not shown) and power supply lines (not shown). The field effect transistors Q1, Q2, Q3 and Q4 are fabricated on active areas defined in the major surface of a semiconductor substrate 11. A field oxide layer 12 is selectively grown on the major surface, and defines the active areas. Dopant impurity is introduced into the active areas, and the active areas are covered with thin gate oxide layers 13. Gate electrodes 14 are respectively formed on the thin gate oxide layers 13, and channel regions under the gate electrodes 14 separate the associated active areas into source regions and drain regions. Though not shown in FIG. 5, the gate electrodes 14 are connected to a signal source, and power voltages are selectively supplied to the source regions of the field effect transistors Q1, Q2 and Q4. The field effect transistors Q1, Q2, Q3 and Q4 are covered with an inter-level insulating layer 15, and signal lines S1 and S2 are formed on the inter-level insulating layer 15. The inter-level insulating layer 15 is deleted from the layout shown in FIG. 5 for the sake of better understanding. Contact holes are formed in the inter-level insulating layer 15, and reach the drain region of the field effect transistor Q4, the drain region of the field effect transistor Q1 and the source region of the field effect transistor Q3, respectively. The signal lines S1 and S2 are formed on the inter-level insulating layer 15. The signal line S1 is connected at one end thereof through the contact hole to the drain region of the field effect transistor Q4 and at the other end thereof to another circuit component (not shown) of the integrated circuit. The signal line S2 is connected at one end thereof through the contact hole to the drain region of the field effect transistor Q1 and at the other end thereof through the contact hole to the source region of the field effect transistor Q3. The signal lines S1 and S2 may be formed of polysilicon, metal such as aluminum or copper or have a polyside structure. The signal lines S1 and S2 are covered with an insulating layer 16.

The computer system is assumed to select the signal line S1 at step S101. Description is firstly made on the estimation of the parasitic capacitance PC coupled to the signal line S1 on the assumption that the signal line S1 is shorter than the critical length LR and, thereafter, on the assumption that the signal line S1 is shorter than the critical length LR.

The computer system determines the total length Lx of the signal line S1 at step S102. The determination of the total length Lx is a part of common knowledge to skilled person in the layout design technology, and, for this reason, no further description is incorporated hereinbelow. The computer system compares the total length Lx with the critical length LR at step S104. When the signal line S1 is shorter than the critical length LR, the answer is given negative, and the computer system proceeds to step S107.

The computer system determines the parasitic capacitance PC of the signal line S1 through the estimating sequence shown in FIG. 1. Using the grating used in the layout design work, the computer system divides the signal line S1 into plural parts as by step S201, and selects one of the parts as by step S203. The computer system analyzes the environment around the selected part S1x as by step S204. In the analysis, the computer system three-dimensionally searches the integrated circuit around the selected part S1x for a circuit component influential in the estimation and a signal line also influential in the estimation. The field effect transistor Q2 and the signal line S2 are influential in the estimation (see FIG. 6). The computer system determines influential factors such as relative relation to the selected part S1x, dimensions of the source/drain regions SD of the field effect transistor Q2, dimensions of the gate electrode 14 of the field effect transistor Q2 and dimensions of the signal line S2 to be considered in the estimation of the parasitic capacitance PCx, the distance from the selected part S1x to the source/drain regions SD, the gate electrode 14 and the signal line S2, the dielectric constant of the insulating material forming the inter-level insulating layer 15 and the dielectric constant of the insulating material forming the upper insulating layer 16. The computer system accesses the pieces of data information representative of the capacity parameter table, and looks for capacity parameters consistent with or approximated to the influential factors. The computer system substitutes the selected capacity parameters for the variables in the mathematical expression, and calculates capacitances C11, C12 and C13 as by step S207. The sum of the capacitances C11, C12 and C13 is the parasitic capacitance PCx coupled to the selected part S1x. The computer system repeats the above-described steps S203 to S207 for the other parts of the signal line S1, and the parasitic capacitances PCi are added together so as to determine the parasitic capacitance PC coupled to the signal line S1 as by step S209. Thus, the computer system determines the parasitic capacitance PC coupled to the signal line S1 through the estimating sequence similar to the prior art. The computer system takes the individuality of the environment around the selected part into account, and accurately determines the parasitic capacitance PC. However, the computer system consumes a relatively long time for the estimation.

On the other hand, if the selected signal line S1 is longer than the critical length LR, the computer system fetches the piece of data information indicative of the capacitance CR coupled to the unit length, and multiplies the capacitance CR by the total length Lx at step S106 (see FIG. 4).

Figure 7:
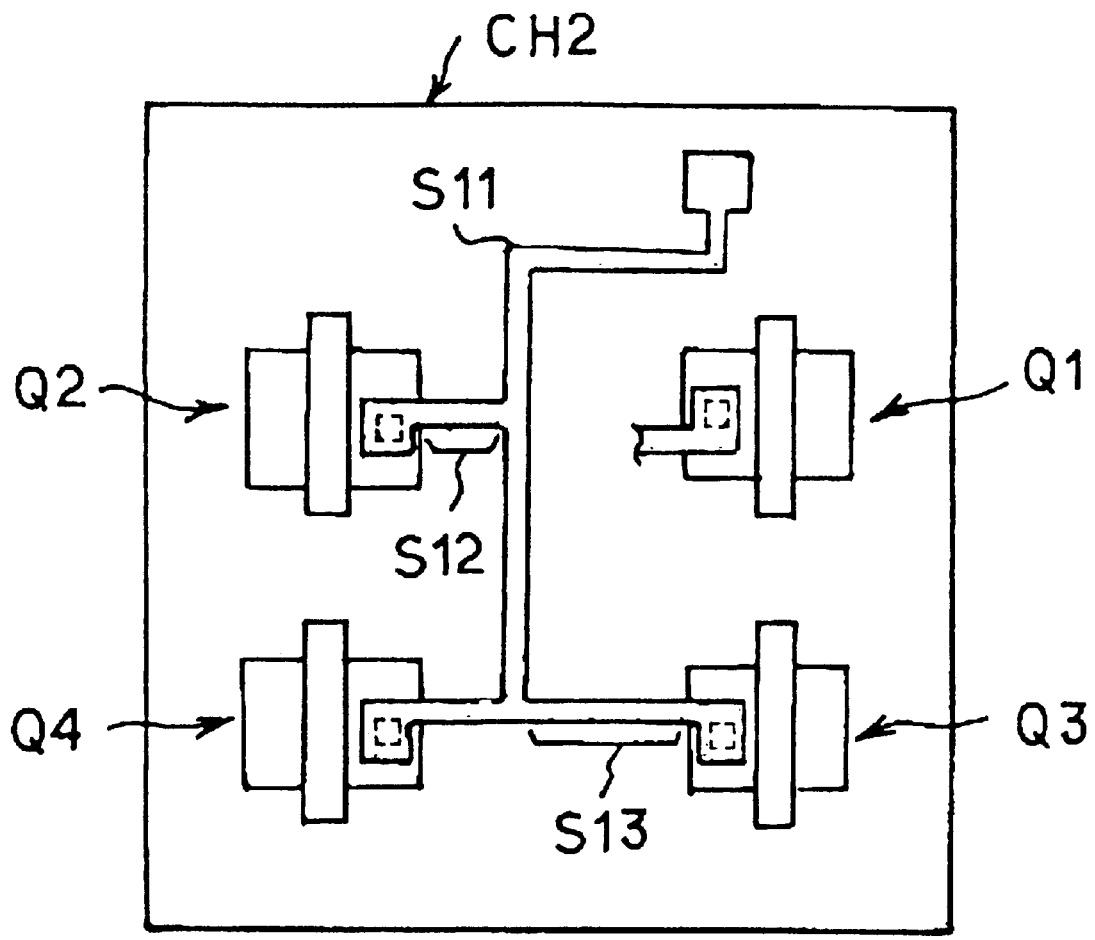
FIG. 7 is a plane view showing another layout of an integrated circuit to be investigated.

The above-described estimating sequence is available for a semiconductor chip CH2 containing another integrated circuit shown in FIG. 7. Field effect transistors Q1, Q2, Q3 and Q4 and a signal line S11 are incorporated in the integrated circuit. The signal line S11 is three times bent between the drain region of the field effect transistor Q4 and a signal pad, and conductive portions S12 and S13 are branched therefrom. In this instance, the length of the conductive portion S12 and the length of the other conductive portion S13 are added to the length between the drain region and the signal pad at step S102, and the total length is compared with the critical length at step S104. The present invention confirmed that the parasitic capacitance PC was accurately estimated at step S106.

As will be understood from the foregoing description, the estimating sequence is branched into the two courses, i.e., steps S103, S105 and S106 and steps S107 equivalent to steps S203 to S208 depending upon the length Lx of the selected signal line. Although the second course is time-consuming as similar to the prior art method, the first course is simple, and the parasitic capacitance PC is determined through the multiplication. As a result, the estimation is completed within a short time.

Method for Calculating Capacitance Coupled to Unit Length

Figure 8:
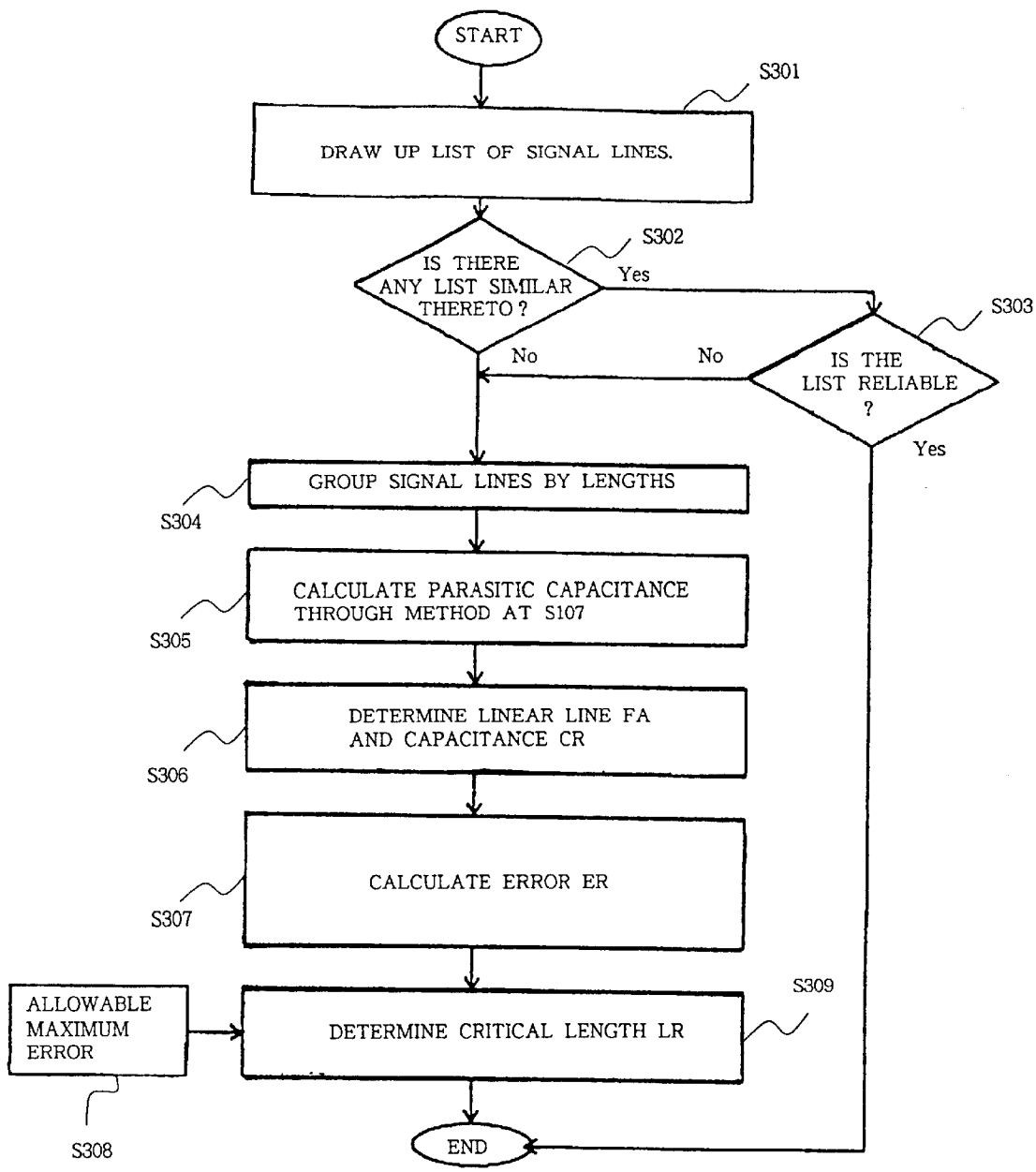
FIG. 8 is a flow chart showing a method for determining a critical length and a parasitic capacitance coupled to unit length.

FIG. 8 illustrates a method for determining the critical length LR and the capacitance CR. The method is also realized by using a computer system. When the computer system is instructed to determine the critical length LR and the capacitance CR, the computer system firstly extracts signal lines from layout data for a given integrated circuit, and draws up a list of signal lines as by step S301. Each of the extracted signal lines is accompanied with the following data information, i.e., the kind of integrated circuit from which the signal lines are extracted, the kinds of signal lines and the length of the signal lines.

Subsequently, the computer system accesses a database which stores the lists already drawn up for signal lines in other integrated circuits. The database further contains the critical length LR and the capacitance CR determined on the basis of each list and historical data representative of the results of estimation already carried out. The computer system checks the database to see whether or not any one of the lists stores the data information of the same kind of signal lines incorporated in an integrated circuit identical with or similar to the given integrated circuit as by step S302.

If the answer at step S302 is given affirmative, the computer system checks the historical data associated with the selected list to see whether or not the critical length LR and the capacitance CR are reliable as by step S303. If the critical length LR and the capacitance CR are reliable, the answer at step S303 is given affirmative, and the computer system terminates the sequence.

The computer system employs the critical length LR and the capacitance CR to estimate the parasitic capacitance of the given integrated circuit.

On the other hand, when the answer at either step S302 or S303 is given negative, the computer system proceeds to step S304. The computer system checks the list for the given integrated circuit to see what signal lines are equal in length, and groups the signal lines by lengths. The computer system selects several signal lines from each of the groups.

Subsequently, the computer system calculates the parasitic capacitance PC coupled to each of the selected signal lines in each group through the method similar to step S107 as by step S305. The computer system determines the linear line FA through the linear approximation and, thereafter, the parasitic capacitance CR coupled to unit length as by step S306.

Subsequently, the computer system multiplies the parasitic capacitance CR by the length of each selected signal line, and calculates the difference between the product, i.e., the parasitic capacitance coupled to the selected signal line and the parasitic capacitance calculated at step S305. The computer system divides the difference by the parasitic capacitance calculated at step S305, and determines the error ER as by step S307. The calculated values of the error ER form the envelope shown in FIG. 3. The computer system stores an allowable maximum error, and reads out the allowable maximum error as by step S308. A designer selects the allowable maximum error depending upon the request for the integrated circuit. The allowable maximum error defines a neighborhood of the linear line FA. If the error ER falls within the neighborhood, the error is considered to be on the linear line FA.

The computer system compares the error ER with the allowable maximum error to determine the signal line, the parasitic capacitance of which is considered to be on the linear line FA. The computer system checks other signal lines longer than the signal line to see whether or not the values of the error ER are also considered to be on the linear line FA. If the answer is affirmative, the computer system determines the length of the signal line to be the critical length LR as by step S309. The computer system terminates the sequence at "end".

The capacitance CR and the critical length LR are used in the estimation of parasitic capacitance coupled to signal lines of the given integrated circuit. As described hereinbefore, the computer system compares the selected signal line with the critical length LR at step S104. If the selected signal line is longer than the critical length LR, the computer system simply multiplies the capacitance CR by the length Lx at step S106, and determines the product to be the parasitic capacitance PC coupled to the selected signal line.

As will be appreciated from the foregoing description, the estimating sequence of the method according to the present invention is branched into the two courses depending upon the length of the signal line. Although one of the courses is similar to the prior art estimating sequence, the other is much simpler than the prior art estimating sequence, and the estimation is completed within a time period shorter than that of the prior art estimation.

Although a particular embodiment of the present invention has been shown and described, it will be apparent to those skilled in the art that various changes and modifications may be made without departing from the spirit and scope of the present invention.

What is claimed is:

1. A method for estimating a parasitic capacitance coupled to a signal line forming a part of an integrated circuit incorporated in a semiconductor device, comprising the steps of:

a) preparing a first piece of data information indicative of a minimum length for calculating a parasitic capacitance as a function of the length of a signal line, a second piece of data information indicative of a capacitance considered to be coupled to a unit length of signal lines and third pieces of data information used for estimating the parasitic capacitance coupled to a signal line through a known method;

b) determining the length of a given signal line;

c) comparing said length of said given signal line with said minimum length so as to determine whether or not said function is available for determining the parasitic capacitance coupled to said given signal line;

d) determining said parasitic capacitance coupled to said given signal line by using said function once when said given signal line is equal to or greater than said minimum length; and e) determining said parasitic capacitance coupled to said given signal line by using said known method without execution of said step d) when said given signal line is less than said minimum length.

2. The method as set forth in claim 1, in which said function is expressed by a linear line passing through an origin indicative of said parasitic capacitance of zero at said length of zero.

3. The method as set forth in claim 2, in which said minimum length is determined through a method including the steps of selecting signal lines different in length from one another, determining said parasitic capacitance coupled to each of said signal lines by using said known method, approximating relative values of said parasitic capacitance expressed by a dispersion to said linear line, selecting a signal line with the relative value of said parasitic capacitance substantially on said linear line from said signal lines, checking other signal lines longer than said signal line to see whether or not the relative values thereof are substantially on said linear line, and determining the length of said signal line to be said minimum length when an answer at said checking step is given affirmative.

4. The method as set forth in claim 3, in which each of said relative values is representative of the ratio of difference between the value of said parasitic capacitance and a corresponding value on said linear line to said corresponding value.

5. The method as set forth in claim 2, in which the gradient of said linear line is determined to be said capacitance considered to be coupled to said unit length.

6. The method as set forth in claim 1, in which said known method is featured by repetition of a calculation.

7. The method as set forth in claim 6, in which said know method comprises the steps of dividing said given signal line into parts, selecting one of said parts, checking the environment around said one of said parts to see whether or not there is at least one conductive member capacitively coupled to said one of said parts, calculating a capacitance between said at least one conductive member and said one of said parts when the answer at the checking step is given affirmative, repeating said checking and calculating steps for each of the others of said parts, and adding all capacitances for determining said calculating step to determine said parasitic capacitance coupled to said given signal line.

8. The method as set forth in claim 1, in which said given signal line has a trunk portion and at least one branched portion branched from said trunk portion, and said step by) includes the sub-steps of b-1) determining the length of said trunk portion and the length of said at least one branched portion, and b-2) adding said length of said trunk portion to said length of said at least one branched portion for determining said length of said given signal line.

9. The method as set forth in claim 1, in which said capacitance considered to be coupled to said unit length is multiplied by said length of given signal line in said step d) for determining said parasitic capacitance coupled to said given signal line.

10. The method as set forth in claim 1, in which said minimum length and said capacitance considered to be coupled to said unit length are selected from candidates already used.

11. The method as set forth in claim 10, in which candidates are stored in a data base together with pieces of historical information representative of reliability of said candidates, and one of said candidates is employed when said one of said candidates was used for signal lines similar to said given signal line and incorporated in a semiconductor device similar to said semiconductor device.

\* \* \* \* \*